(12) United States Patent
Jang et al.

(10) Patent No.: US 11,189,541 B2
(45) Date of Patent: Nov. 30, 2021

(54) SEMICONDUCTOR PACKAGE

(71) Applicant: Samsung Electro-Mechanics Co., Ltd., Suwon-si (KR)

(72) Inventors: Jung Mok Jang, Suwon-si (KR); Han Su Park, Suwon-si (KR); Hyun Kook Cho, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 72 days.

(21) Appl. No.: 16/776,818

(22) Filed: Jan. 30, 2020

(65) Prior Publication Data

US 2021/0043536 A1 Feb. 11, 2021

(30) Foreign Application Priority Data

Aug. 7, 2019 (KR) .................... 10-2019-0096274

(51) Int. Cl.
*H01L 23/367* (2006.01)
*H01L 23/31* (2006.01)
*H01L 23/373* (2006.01)
*H01L 25/16* (2006.01)
*H01L 23/00* (2006.01)

(52) U.S. Cl.
CPC ........ *H01L 23/3675* (2013.01); *H01L 23/315* (2013.01); *H01L 23/3121* (2013.01); *H01L 23/3736* (2013.01); *H01L 24/16* (2013.01); *H01L 25/16* (2013.01); *H01L 2224/16225* (2013.01); *H01L 2924/19105* (2013.01)

(58) Field of Classification Search
CPC ............ H01L 23/3675; H01L 23/3121; H01L 23/3736; H01L 24/16; H01L 25/16; H01L 2224/16225; H01L 2924/19105
See application file for complete search history.

(56) References Cited

U.S. PATENT DOCUMENTS

| 5,933,709 | A | 8/1999 | Chun | |
|---|---|---|---|---|
| 8,375,576 | B2 | 2/2013 | Kwon | |
| 2001/0000924 | A1* | 5/2001 | Karnezos | ............ H01L 23/4334 257/666 |
| 2003/0011053 | A1* | 1/2003 | Yasunaga | ............ H01L 23/4334 257/678 |

(Continued)

FOREIGN PATENT DOCUMENTS

| JP | 10-504136 A | 4/1998 |
|---|---|---|
| JP | 2920523 B2 | 7/1999 |
| WO | WO 96/02942 A1 | 2/1996 |

*Primary Examiner* — Peniel M Gumedzoe
(74) *Attorney, Agent, or Firm* — NSIP Law

(57) ABSTRACT

A semiconductor package includes a substrate, an electronic component mounted on an upper surface of the substrate so that a lower surface of the electronic component faces the upper surface of the substrate, a heat slug disposed on an upper surface of the electronic component so that a lower surface of the heat slug faces the upper surface of the electronic component, a bonding material bonding the heat slug to the upper surface of the electronic component, and an encapsulant in which the heat slug and the electronic component are embedded. A side surface of the heat slug extending between an edge of the lower surface of the heat slug and an edge of an upper surface of the heat slug forms a recess with the upper surface of the electronic component.

19 Claims, 12 Drawing Sheets

(56) References Cited

U.S. PATENT DOCUMENTS

| | | | |
|---|---|---|---|
| 2004/0140546 A1* | 7/2004 | Lee | H01L 24/33 |
| | | | 257/686 |
| 2006/0091527 A1* | 5/2006 | Tsai | H01L 23/3128 |
| | | | 257/706 |
| 2006/0202313 A1* | 9/2006 | Tan | H01L 24/32 |
| | | | 257/676 |
| 2008/0067645 A1* | 3/2008 | Foong | H01L 23/42 |
| | | | 257/675 |
| 2008/0305584 A1* | 12/2008 | Foong | H05K 7/20445 |
| | | | 438/122 |
| 2013/0221511 A1* | 8/2013 | Higgins, III | H01L 23/4334 |
| | | | 257/690 |

* cited by examiner

SEMICONDUCTOR PACKAGE

CROSS-REFERENCE TO RELATED APPLICATIONS

This application claims the benefit under 35 USC 119(a) of Korean Patent Application No. 10-2019-0096274 filed on Aug. 7, 2019, in the Korean Intellectual Property Office, the entire disclosure of which is incorporated herein by reference for all purposes.

BACKGROUND

1. Field

This application relates to a semiconductor package.

2. Description of Related Art

Recently, there is increasing demand for a semiconductor package having a structure with an improved heat dissipation performance due to an increase in heat generated by an electronic component (for example, an integrated circuit (IC)).

A heat slug made of a metal material having a high thermal conductivity may be bonded to an electronic component by a bonding material to increase heat dissipation from the electronic component. However, a defect may occur due to a difference in coefficients of thermal expansion (CTE) between components.

For example, cracking may occur in an encapsulant, for example, an epoxy molding compound (EMC), in which the electronic component and the heat slug are encapsulated, due to a difference in coefficients of thermal expansion (CTE) between the encapsulant, the heat slug, and the bonding material bonding the heat slug to the electronic component.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor package includes a substrate; an electronic component mounted on an upper surface of the substrate so that a lower surface of the electronic component faces the upper surface of the substrate; a heat slug disposed on an upper surface of the electronic component so that a lower surface of the heat slug faces the upper surface of the electronic component; a bonding material bonding the heat slug to the upper surface of the electronic component; and an encapsulant in which the heat slug and the electronic component are embedded, wherein a side surface of the heat slug extending between an edge of the lower surface of the heat slug and an edge of an upper surface of the heat slug forms a recess with the upper surface of the electronic component.

An area of the upper surface of the heat slug may be greater than an area of the lower surface of the heat slug.

The side surface of the heat slug may include a first curved surface.

The first curved surface may extend in a curved upward direction away from the edge of the lower surface of the heat slug and may have a first radius of curvature, and the side surface of the heat slug may further include a second curved surface extending in a curved upward direction from an upper end of the first curved surface to the edge of the upper surface of the heat slug and having a second radius of curvature different from the first radius of curvature.

The first curved surface may extend in a curved upward direction away from the edge of the lower surface of the heat slug; and the side surface of the heat slug may further include a flat surface extending in an inclined upward direction from an upper end of the first curved surface to the edge of the upper surface of the heat slug so that the flat surface is inclined with respect to the upper surface of the electronic component.

The edge of the upper surface of the heat slug may not protrude beyond an edge of the electronic component when the semiconductor package is viewed from above.

The semiconductor package may further include an oxide coating layer disposed on the side surface of the heat slug.

The encapsulant may include an opening disposed above the upper surface of the heat slug.

The semiconductor package may further include a heat transfer member disposed in the opening, wherein the heat transfer member may be made of any one of a solder paste, a metal paste, and a conductive epoxy paste.

A lower end of the heat transfer member may be disposed in contact with the upper surface of the heat slug.

The upper surface of the heat slug may be even with an upper surface of the encapsulant so that the upper surface of the heat slug is exposed outside the encapsulant.

The heat slug may include a body having a lower surface facing the upper surface of the electronic component; and a plurality of heat dissipation projections extending in a vertical upward direction from an upper surface of the body.

An upper end portion of each of the heat dissipation projections may protrude through an upper surface of the encapsulant in a vertical upward direction so that the upper end portion of each of the heat dissipation projections is exposed outside the encapsulant.

The heat slug may be made of copper.

In another general aspect, a semiconductor package includes a substrate; an electronic component mounted on an upper surface of the substrate so that a lower surface of the electronic component faces the upper surface of the substrate; a heat slug disposed on an upper surface of the electronic component so that a lower surface of the heat slug faces the upper surface of the electronic component; a bonding material bonding the heat slug to the upper surface of the electronic component; and an encapsulant in which the heat slug and the electronic component are embedded, wherein a side surface of the heat slug extending between an edge of the lower surface of the heat slug and an edge of an upper surface of the heat slug includes a first curved surface extending in a curved upward direction away from the edge of the lower surface of the heat slug; and a flat surface extending in an inclined upward direction from an upper end of the first curved surface to the edge of the upper surface of the heat slug so that the flat surface is inclined relative to the upper surface of the electronic component.

An area of the upper surface of the heat slug may greater than an area of the lower surface of the heat slug.

In another general aspect, a semiconductor package includes a substrate; an electronic component mounted on an upper surface of the substrate so that a lower surface of the electronic component faces the upper surface of the substrate; a heat slug disposed on an upper surface of the electronic component so that a lower surface of the heat slug faces the upper surface of the electronic component; a bonding material disposed in contact with a side surface of the heat slug and the upper surface of the electronic component and bonding the heat slug to the upper surface of the electronic component; and an encapsulant in which the electronic component, the heat slug, and the bonding material are embedded, wherein an edge of an upper surface of the heat slug protrudes beyond an edge of the lower surface of the heat slug when the heat slug is viewed in a direction perpendicular to the upper surface of the heat slug.

The side surface of the heat slug may extend from the edge of the lower surface of the heat slug to the edge of the upper surface of the heat slug and may include a first surface extending in a first direction; and a second surface extending in a second direction different from the first direction.

The side surface of the heat slug may extend from the edge of the lower surface of the heat slug to the edge of the upper surface of the heat slug and may include a curved surface; and a flat surface.

The bonding material may be disposed in contact with a lower portion of the side surface of the heat slug, and the encapsulant may be disposed in contact with the bonding material and an upper portion of the side surface of the substrate.

In another general aspect, a semiconductor package includes a substrate; an electronic component mounted on an upper surface of the substrate so that a lower surface of the electronic component faces the upper surface of the substrate; a heat slug disposed on an upper surface of the electronic component so that a lower surface of the heat slug faces the upper surface of the electronic component; a bonding material disposed in contact with a side surface of the heat slug and the upper surface of the electronic component and bonding the heat slug to the upper surface of the electronic component; and an encapsulant in which the electronic component, the heat slug, and the bonding material are embedded, wherein a portion of the encapsulant is disposed between an upper end portion of the heat slug and the upper surface of the electronic component.

The side surface of the heat slug may form a recess with the upper surface of the electronic component, and the bonding material and the portion of the encapsulant disposed between the upper end portion of the heat slug and the upper surface of the electronic component may be disposed in the recess.

The side surface of the heat slug may extend from an edge of the lower surface of the heat slug to an edge of an upper surface of the heat slug and may include a first surface extending in a first direction; and a second surface extending in a second direction different from the first direction.

The side surface of the heat slug may extend from an edge of the lower surface of the heat slug to an edge of an upper surface of the heat slug and may include a curved surface; and a flat surface.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
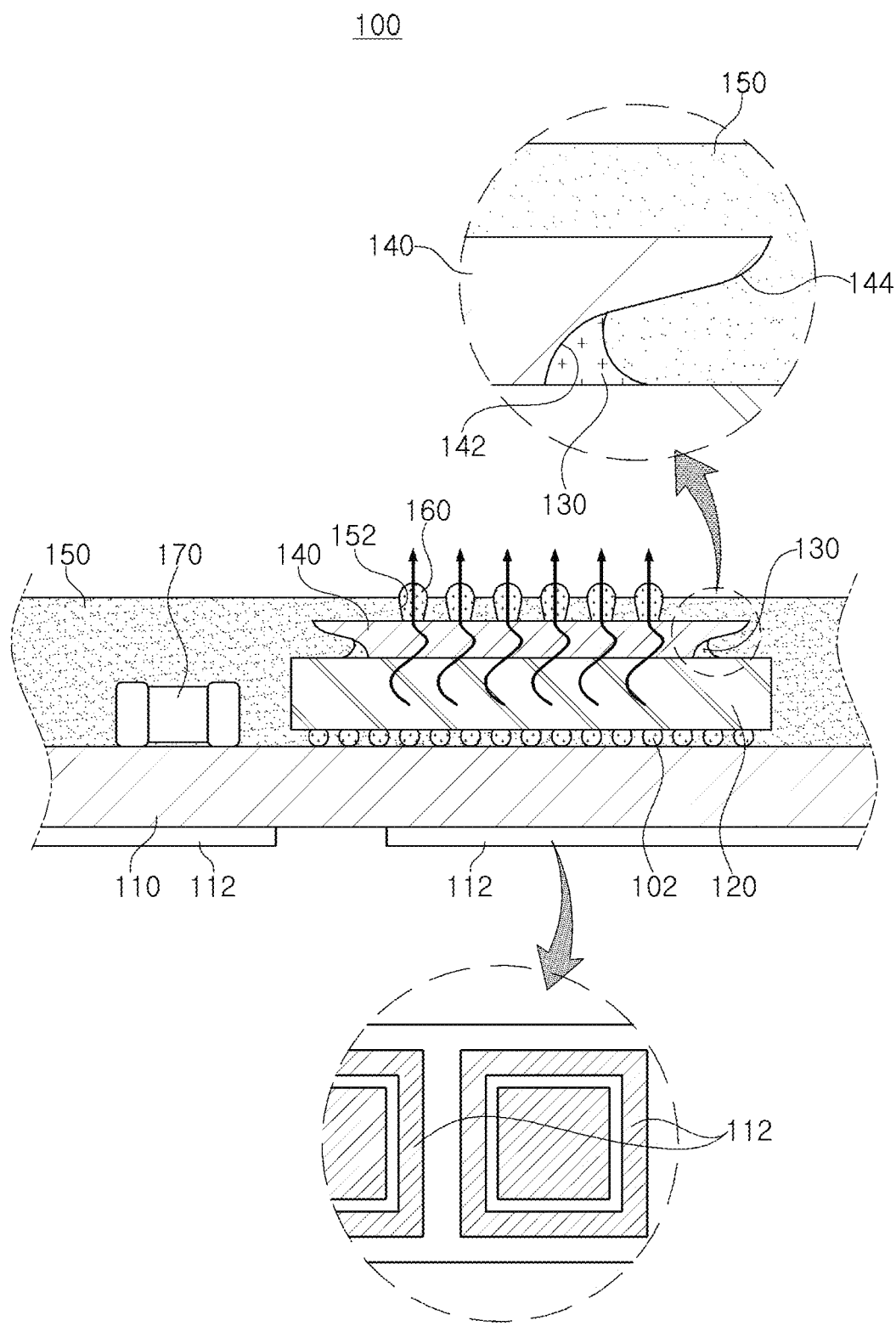
FIG. 1 is a schematic cross-sectional view illustrating an example of a semiconductor package.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated by 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Figure 2:
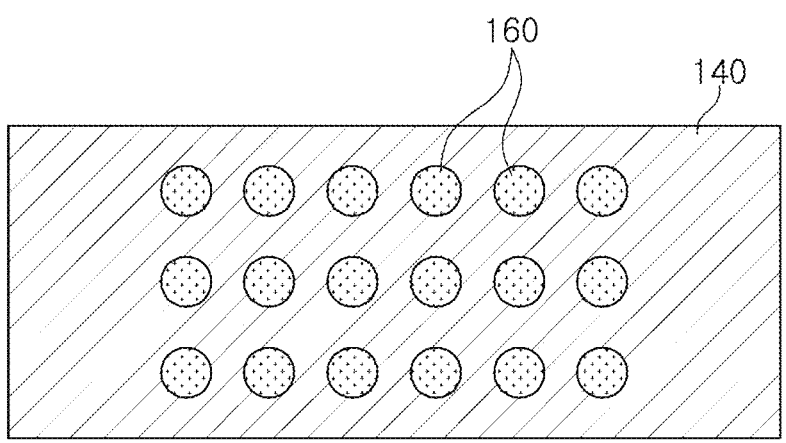
FIG. 2 is a plan view illustrating an example of a heat slug and heat transfer members of the semiconductor package illustrated in FIG. 1.

FIG. 1 is a schematic cross-sectional view illustrating an example of a semiconductor package, and FIG. 2 is a plan view illustrating an example of a heat slug and heat transfer members of the semiconductor package illustrated in FIG. 1.

Referring to FIGS. 1 and 2, a semiconductor package 100 includes a substrate 110, an electronic component 120, a bonding material 130, a heat slug 140, an encapsulant 150, and heat transfer members 160.

The substrate 110 has a flat plate shape and includes at least one insulating layer (not illustrated) and at least one wiring layer (not illustrated). A material of the insulating layer may be a thermosetting resin such as an epoxy resin, a thermoplastic resin such as a polyimide resin, a resin such as the epoxy resin or the thermoplastic resin impregnated together with an inorganic filler into a core material such as glass fibers, a glass cloth, or a glass fabric, a prepreg, an Ajinomoto Build-up Film (ABF), FR-3, or Bismaleimide Triazine (BT). A material of the wiring layer may be copper (Cu), aluminum (Al), silver (Ag), tin (Sn), gold (Au), nickel (Ni), lead (Pb), or titanium (Ti), or an alloy of any two or more thereof.

As an example, the substrate 110 may be a rigid printed circuit board, a flexible printed circuit board, or a rigid-flexible printed circuit board. The substrate 110 may be, for example, a single-layer printed circuit board or a multilayer printed circuit board.

The substrate 110 is provided with a plurality of external terminals (not illustrated) connected to the at least one wiring layer. The external terminals may be solder balls, conductive bumps, a pin grid array, a lead grid array, copper pillars, or any combination of any two or more thereof.

A plurality of antennas 112 spaced apart from each other are disposed on a lower surface of the substrate 110. The plurality of antennas 112 may be Wi-Fi antennas, 5G antennas, or any other type of antenna, and may be formed on the lower surface of the substrate 110 by a patterning process. The plurality of antennas 112 may be connected to each other.

The electronic component 120 is mounted on an upper surface of the substrate 110. The electronic component 120 is mounted on the upper surface of the substrate 110 through connection members 102. For example, solder balls or copper pillars may be used as the connection members 102. The electronic component 120 may be a radio-frequency integrated circuit (RFIC) for wireless communications. As an example, the electronic component 120 has a cuboid shape. However, the shape of the electronic component 120 is not limited thereto, and may be changed as desired.

The bonding material 130 is disposed on an upper surface of the electronic component 120. The bonding material 130 bonds the heat slug 140 to the electronic component 120. The bonding material 130 may be a thermally conductive adhesive, or a thermal interface material (TIM) having improved heat transfer characteristics. However, the bonding material 130 is not limited thereto, and the bonding material 130 may include any one or any combination of any two or more of a thermally conductive compound, a thermally conductive gel, and a prepreg. As an example, the bonding material 130 may be formed by curing a material in a liquid state or a paste form.

Although not illustrated in FIG. 1, the bonding material 130 may extend along an entire perimeter of the heat slug 140. Furthermore, although not illustrated in FIG. 1, a thin layer of the bonding material 130 may be disposed between the upper surface of the electronic component 120 and a lower surface of the heat slug 140.

The heat slug 140 is bonded to the upper surface of the electronic component 120 by the bonding material 130. The heat slug 140 dissipates heat transferred to the heat slug 140 from the electronic component 120. For example, the heat slug 140 is made of copper (Cu) having a high thermal conductivity. However, a material of the heat slug 140 is not limited thereto, and the heat slug 140 may be made of gold (Au), aluminum (Al), nickel (Ni), stainless steel, or an alloy containing any combination of any two or more of copper (Cu), gold (Au), aluminum (Al), nickel (Ni), and stainless steel.

A side surface of the heat slug 140 extending between an edge of the lower surface of the heat slug 140 and an edge of an upper surface of the heat slug 140 forms a recess with the upper surface of the substrate 110. An area of the upper surface of the heat slug 140 is greater than an area of the lower surface of the heat slug 140 so that the edge of the upper surface of the heat slug 140 protrudes beyond the edge of the lower surface of the heat slug 140. As an example, the side surface of the heat slug 140 includes a first curved surface 142 extending in a curved upward direction away from the edge of the lower surface of the heat slug 140 and having a first radius of curvature, and a second curved surface 144 extending in a curved upward direction from an upper end of the first curved surface 142 to the edge of the upper surface of the heat slug 140 and having a second radius of curvature different from the first radius of curvature.

Although not illustrated in FIG. 1, the side surface of the heat slug 140 forming the recess with the upper surface of the electronic component 120 may extend along an entire perimeter of the heat slug 140. The side surface of the heat slug 140 may be formed, for example, by a half-etching process, or any other process capable of forming the side surface.

One result of the side surface of the heat slug 140 forming the recess with the upper surface of the substrate 110 is that damage to the encapsulant 150 is reduced. For example, since the side surface of the heat slug 140 forms the recess with the upper surface of the substrate 110, the occurrence of defects in the semiconductor package 100 caused by cracking occurring in the encapsulant 150 is reduced. This will be described later in detail.

The heat slug 140 does not protrude outwardly beyond a side surface of the electronic component 120. In further detail, the edge of the upper surface of the heat slug 140 does not protrude outwardly beyond the side surface of the electronic component 120. For example, when the semiconductor package 100 is viewed from above, that is, is when the semiconductor package 100 is viewed from above in a direction perpendicular to the upper surface of the heat slug 240, the edge of the upper surface of the heat slug 140 does not protrude beyond an edge of the upper surface of the electronic component 120. For example, when viewed from above, the edge of the upper surface of the heat slug 140 may be aligned with the edge of the upper surface of the electronic component 120, or may be spaced inwardly toward a center of the heat slug 140 from the edge of the upper surface of the electronic component 120. For example, the heat slug 140 may be disposed within a space defined by planes extending upward from side surfaces of the electronic component 120 without contacting the planes, or the edge of the upper surface of the heat slug 140 may lie in one or more of the planes extending upward from the side surfaces of the electronic component 120.

Accordingly, the heat slug 140 is prevented from interfering with other components mounted on the substrate 110 near the electronic component 120.

However, a disposition of the heat slug 140 is not limited to the dispositions described above, and an upper end portion of the heat slug 140 may protrude outwardly beyond the side surface of the electronic component 120 in certain circumstances. As an example, when another component (not illustrated), such as a semiconductor chip or a passive component, is disposed near the electronic component 120 and has a height less than a height of the upper end portion of the heat slug 140, there may be no interference between the other component disposed near the electronic component 120 and the heat slug 140 even if the upper end portion of the heat slug 140 protrudes outwardly beyond the side surface of the electronic component 120 because the recess formed by the side surface of the heat slug 140 with the upper surface of the electronic component 120 may accommodate an upper portion of the other component disposed near the electronic component 120.

As an example, when a thickness of the heat slug 140 is 300 μm, and a vertical distance between an upper surface of the other component disposed near the electronic component 120 and the upper surface of the electronic component 120 is 160 μm, and the upper end portion of the heat slug 140 protrudes outwardly beyond the side surface of the electronic component 120, there may be no interference between the other component disposed near the electronic component 120 and the heat slug 140 because the recess formed by the side surface of the heat slug 140 with the upper surface of the electronic component 120 may accommodate the upper portion of the other component disposed near the electronic component 120.

Furthermore, when the upper end portion of the heat slug 140 protrudes outwardly beyond the side surface of the electronic component 120, a volume of the upper end portion of the heat slug 140 is increased. Therefore, a heat dissipation efficiency of the heat slug 140 is improved.

The electronic component 120 and the heat slug 140 are embedded in the encapsulant 150. The encapsulant 150 has a predetermined strength to protect the electronic component 120 and the heat slug 140 from external impacts. As an example, the encapsulant 150 is an epoxy molding compound (EMC). The encapsulant 150 has openings 152 disposed above the upper surface of the heat slug 140. The heat transfer members 160 are disposed in the openings 152. The heat transfer members 160 are made of any one of a solder paste, a metal paste, and a conductive epoxy paste.

A lower surface of each of the heat transfer members 160 is disposed on the upper surface of the heat slug 140, and an upper end portion of each of the heat transfer members 160 protrudes above an upper surface of the encapsulant 150 through a respective one of the openings 152.

A passive element 170 is mounted on the substrate 110 adjacent to the electronic component 120. The passive element 170 may be an inductor or any other passive element. As an example, a thickness of the passive element 170 is less than a thickness of the electronic component 120 to prevent interference between the heat slug 140 and the passive element 170.

Hereinafter, effects of the heat slug 140 having the side surface that forms the recess with the upper surface of the electronic component 120 will be described in further detail.

Figure 3:
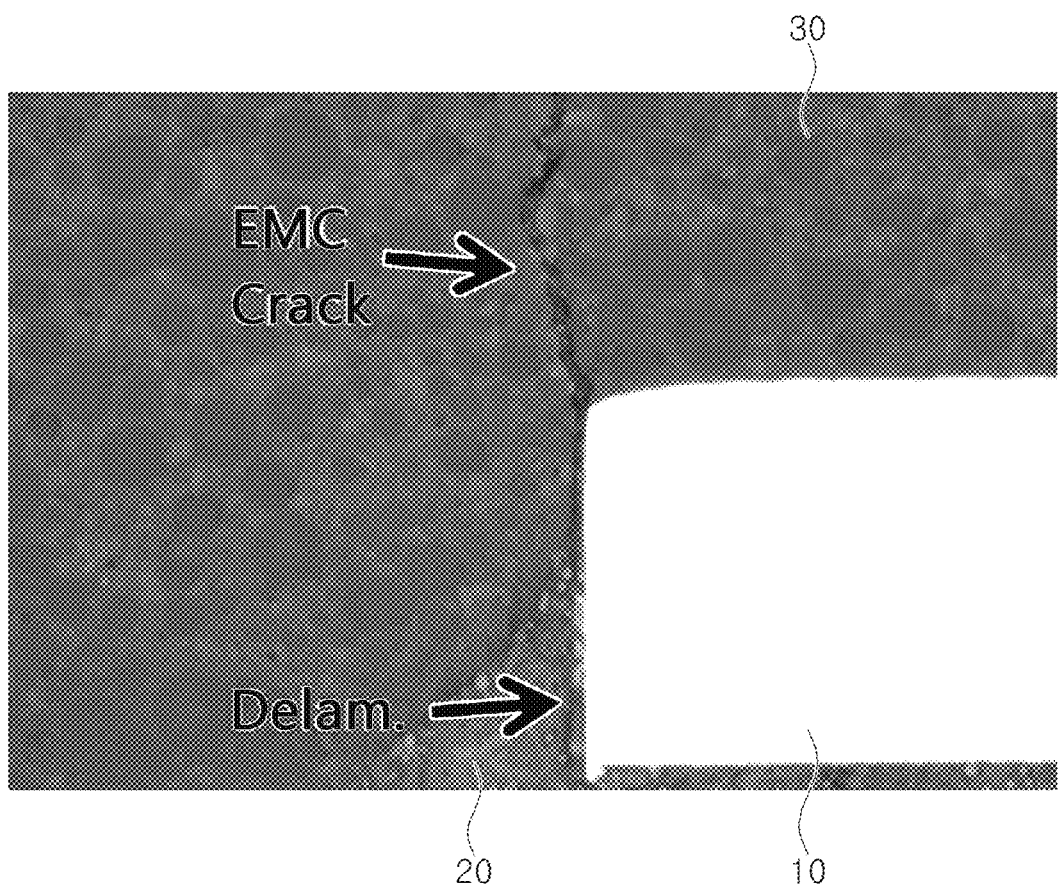
FIGS. 3, 4, and 5 are images illustrating examples of cracking occurring in an encapsulant near a heat slug in a semiconductor package of the related art.
Figure 4:
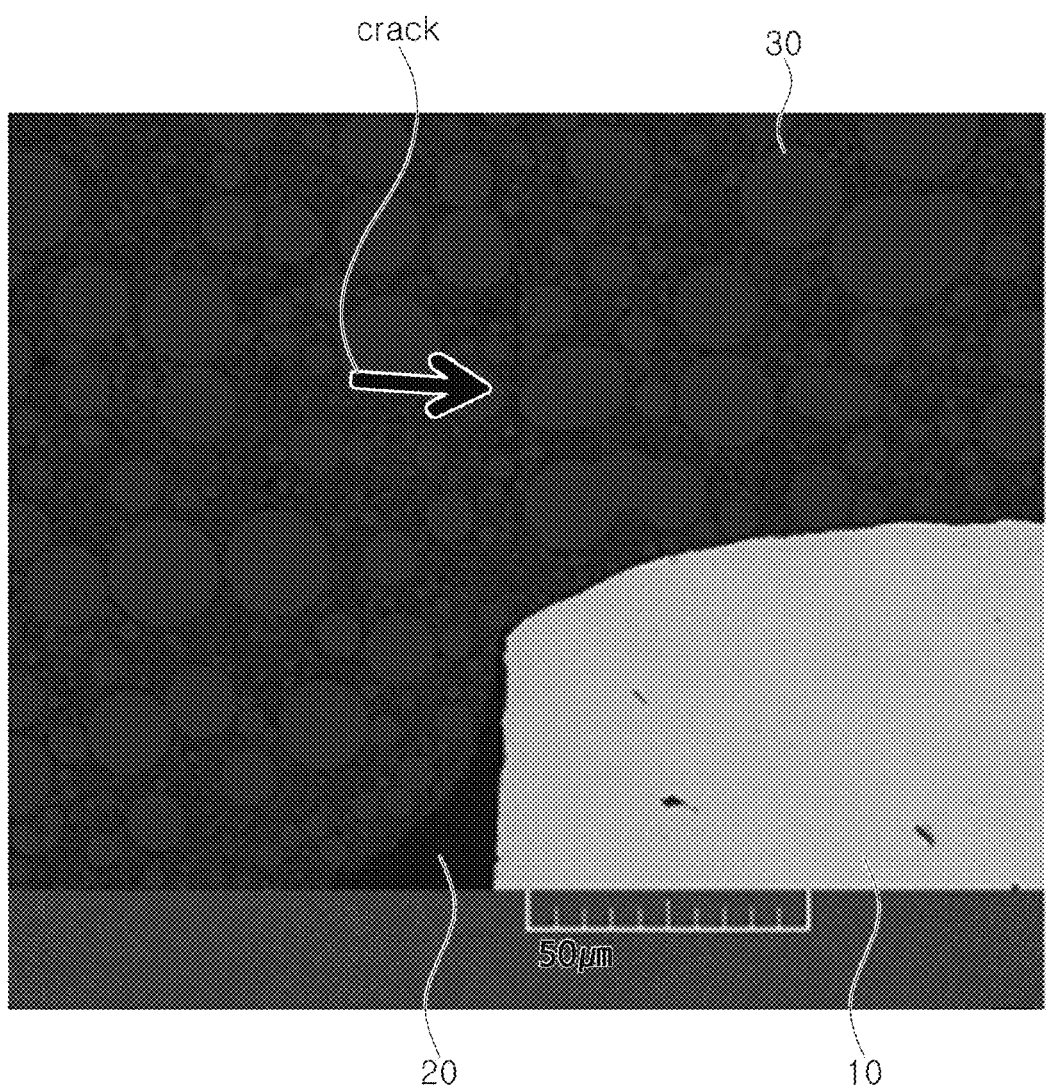
Figure 5:
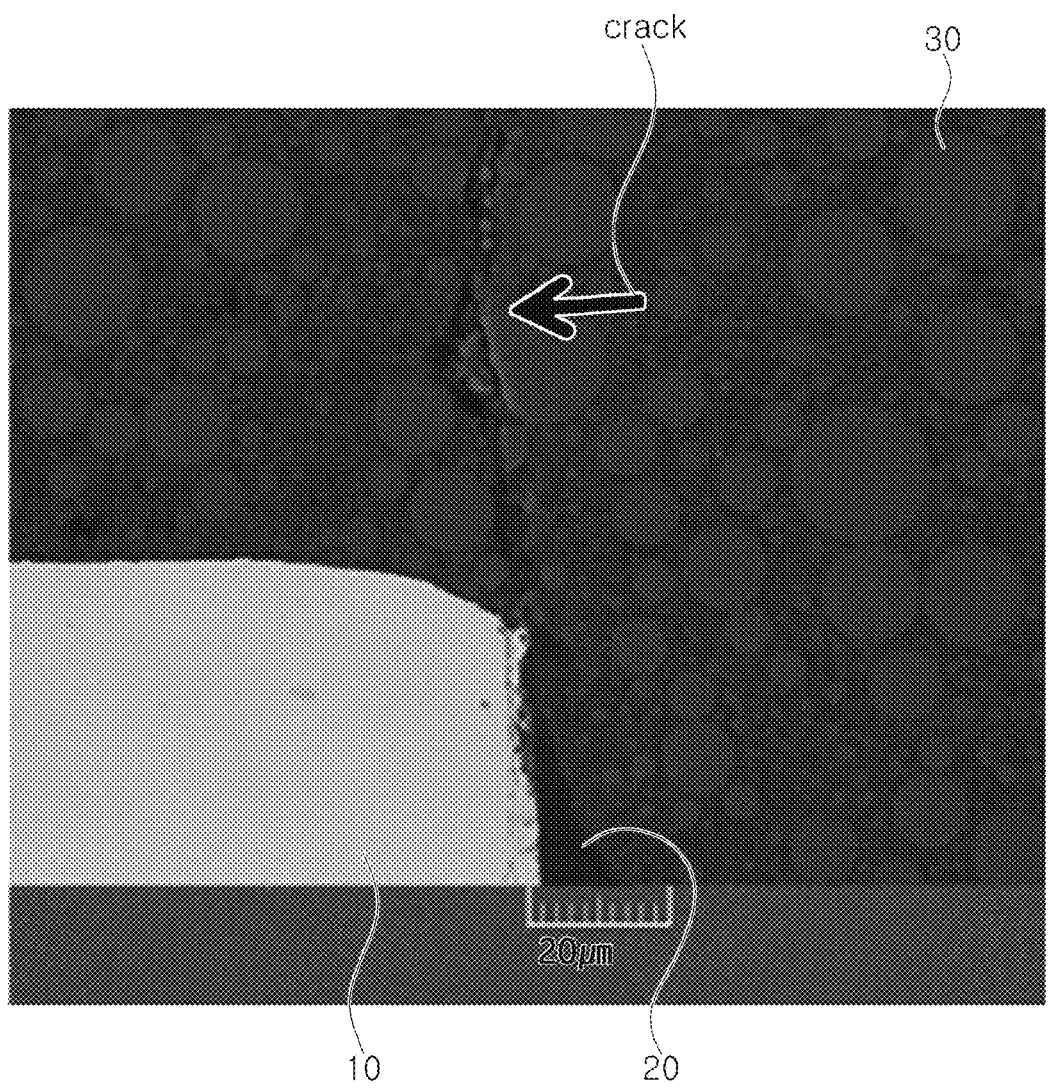

FIGS. 3, 4, and 5 are images illustrating examples of cracking occurring in an encapsulant near a heat slug in semiconductor packages of the related art.

As illustrated in FIGS. 3, 4, and 5, a heat slug 10 of the related art has a vertical side surface. A lower portion of the heat slug 10 is embedded in a bonding material 20, and the bonding material 20 and an upper portion of the heat slug 10 are embedded in an encapsulant 30. Thus, the lower portion of the vertical side surface of the heat slug 10 is in contact with the bonding material 20, and the upper portion of the vertical side surface of the heat slug 10 is in contact with the encapsulant 30.

Examples of coefficients of thermal expansion (CTE) of the heat slug 10, the bonding material 20, and the encapsulant 30 are listed in Table 1 below.

TABLE 1

|  | Electronic Component | Bonding Material | Heat Slug | Encapsulant |
|---|---|---|---|---|
| CTE (ppm/° C.) | 2.7 | 40 (below Tg) 140 (above Tg) | 17 | 9 (below Tg) 25 (above Tg) |

In Table 1, Tg denotes a glass transition temperature.

As can be seen from Table 1, the coefficients of thermal expansion (CTE) of the heat slug 10, the bonding material 20, and the sealing material 30 are different from each other. Therefore, as illustrated in FIG. 3, the bonding material 20 was delaminated from the heat slug 10 during changes in temperature, causing cracking to occur in the bonding material 30.

As illustrated in FIGS. 4 and 5, cracking occurred in the encapsulant 30 during changes in temperature as a result of the difference between the coefficient of thermal expansion (CTE) of the heat slug 10 and the coefficient of thermal expansion (CTE) of the encapsulant 30. In further detail, a force is applied to a contact area between the encapsulant 30 and the side surface of the heat slug 10 during changes in temperature due to the difference between the coefficient of thermal expansion (CTE) of the heat slug 10 and the coefficient of thermal expansion (CTE) of the encapsulant 30. Since the contact area between the encapsulant 30 and the side surface of the heat slug 10 is small, a stress (force per unit area) applied to the contact area is high. Accordingly, cracking occurs in the encapsulant 30 and propagates to an upper surface of the encapsulant 30.

The cracking occurring in the encapsulant 30 causes a defect in the semiconductor package.

However, the heat slug 140 of the semiconductor package 100 illustrated in FIG. 1 has the side surface that forms the recess with the upper surface of the electronic component 120. Accordingly, a contact area between the side surface of the heat slug 140 and the encapsulant 150 is larger than the contact area between the side surface of the heat slug 10 and the encapsulant 30 in the semiconductor packages of the related art illustrated in FIGS. 3 to 5. Thus, a force applied to the contact area between the side surface of the heat slug 140 and the encapsulant 150 during changes in temperature due to the difference between the coefficient of thermal expansion of the heat slug 140 and the coefficient of expansion of the encapsulant 150 is dispersed over a larger contact area than in the semiconductor packages of the related art illustrated in FIGS. 3 to 5, and a stress applied to the larger contact area is smaller than in the semiconductor packages of the related art illustrated in FIGS. 3 to 5. As a result, cracking is prevented from occurring in the encapsulant 150. Moreover, an area of the upper surface of the heat slug 140 is greater than an area of the lower surface of the heat slug 140. Accordingly, even when the bonding material 130 and the heat slug 140 are delaminated from each other, an upper end portion of the heat slug 140 is disposed above a region in which the delamination of the bonding material 130 and the heat slug 140 occurs. As a result, even when cracking occurs in the encapsulant 150, the upper end portion of the heat slug 140 prevents the cracking from propagating to an upper surface of the encapsulant 150.

Heat generated in the electronic component 120 is transferred outside the encapsulant 150 through the bonding material 130, the heat slug 140, and the heat transfer members 160. Accordingly, a heat dissipation performance of the semiconductor package 100 illustrated in FIG. is improved compared to the semiconductor packages of the related art illustrated in FIGS. 3 to 5.

As described above, since the side surface of the heat slug 140 forms the recess with the upper surface of the electronic component 120, the occurrence of defects in the semiconductor package 100 is reduced.

Figure 6:
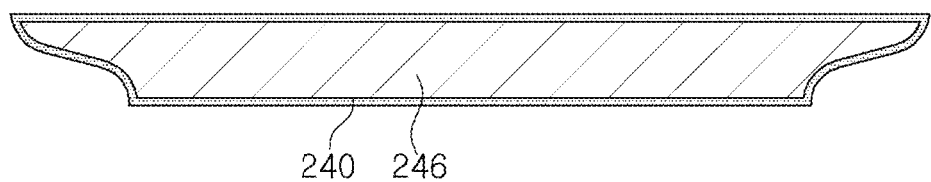
FIG. 6 is a schematic cross-sectional view illustrating another example of a heat slug.
Figure 7:
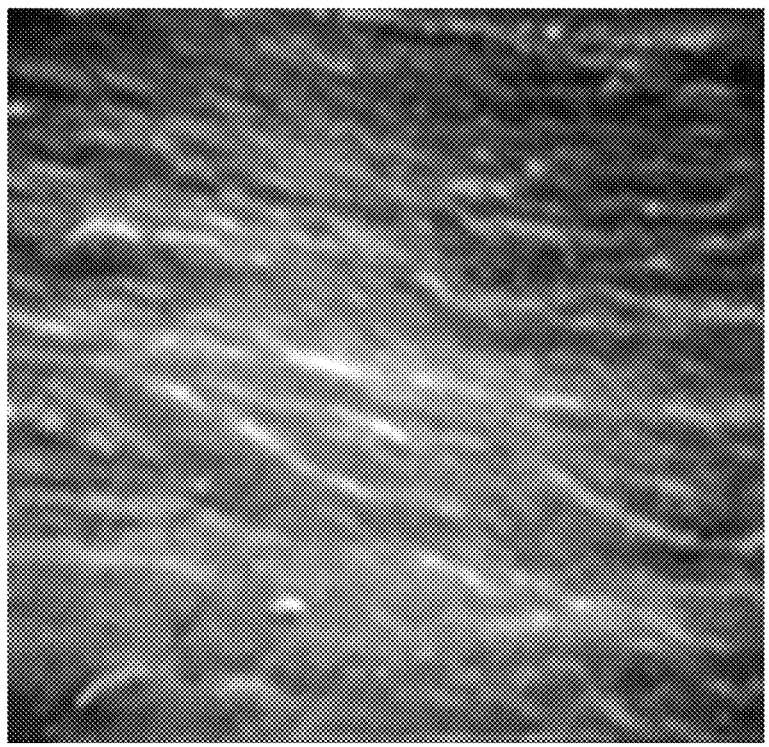
FIG. 7 is an image illustrating an example of a surface of a heat slug without an oxide coating layer formed thereon.
Figure 8:
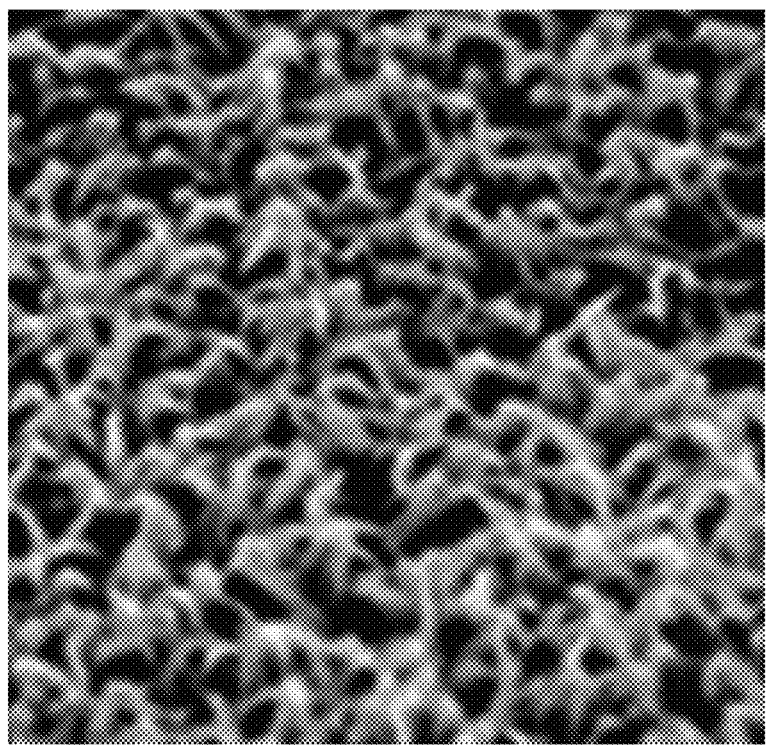
FIG. 8 is an image illustrating an example of a surface of a heat slug having an oxide coating layer formed thereon.

FIG. 6 is a schematic cross-sectional view illustrating another example of a heat slug. FIG. 7 is an image illustrating an example of a surface of a heat slug without an oxide coating layer formed thereon. FIG. 8 is an image illustrating an example of a surface of a heat slug having an oxide coating layer formed thereon.

Referring to FIG. 6, an oxide coating layer 246 is formed on the entire surface of a heat slug 240, that is, on an upper surface, a side surface, and a lower surface of the heat slug 240. The oxide coating layer 246 may be formed by a black oxide surface treatment. A specific surface area (a total surface area per unit of mass) of a surface of the oxide coating layer 246, which is illustrated in FIG. 8, is greater than a specific surface area of a surface of the heat slug 240 without the oxide coating layer 246, which is illustrated in FIG. 7. For example, as illustrated in FIG. 8, a surface roughness of the surface of the oxide coating layer 246 is greater than a surface roughness of the surface of the heat slug 240 without the oxide coating layer 246 as illustrated in FIG. 7, thereby increasing a contact area between the heat slug 240 and the encapsulant 150 illustrated in FIG. 1. Furthermore, oxygen bonding occurs between the oxide coating layer 246 and the encapsulant 150, thereby increasing a bonding force between the encapsulant 150 and the heat slug 240.

The heat slug 240 may be used in the semiconductor package 100 illustrated in FIG. 1 instead of the heat slug 140.

The side surface of the heat slug 240 extending between an edge of the lower surface of the heat slug 240 and an edge of the upper surface of the heat slug 240 forms a recess with the upper surface of the electronic component 120.

Although not illustrated in FIG. 6, the side surface of the heat slug 240 forming the recess with the upper surface of the electronic component 120 may extend along an entire perimeter of the heat slug 240. The side surface of the heat slug 240 may be formed, for example, by a half-etching process, or any other process capable of forming the side surface.

Figure 9:
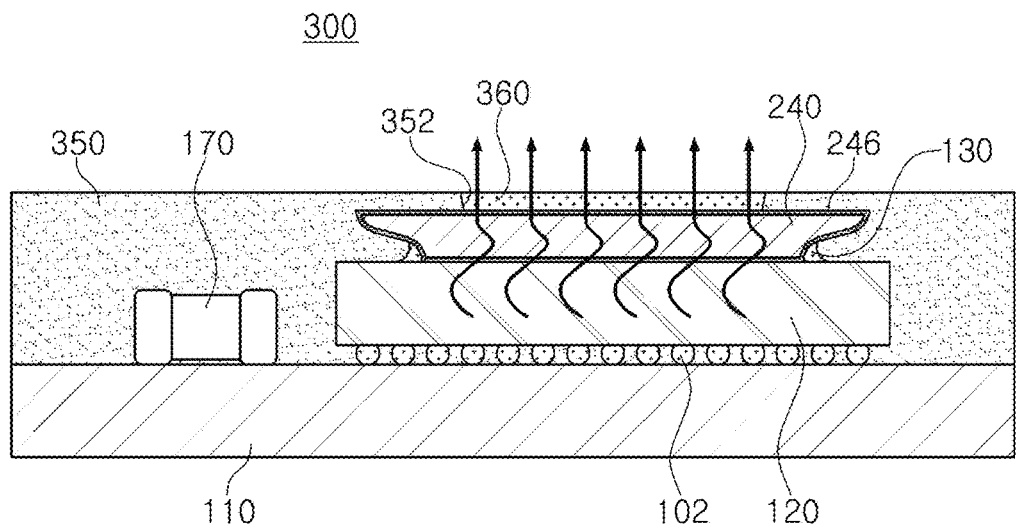
FIG. 9 is a schematic cross-sectional view illustrating another example of a semiconductor package.
Figure 10:
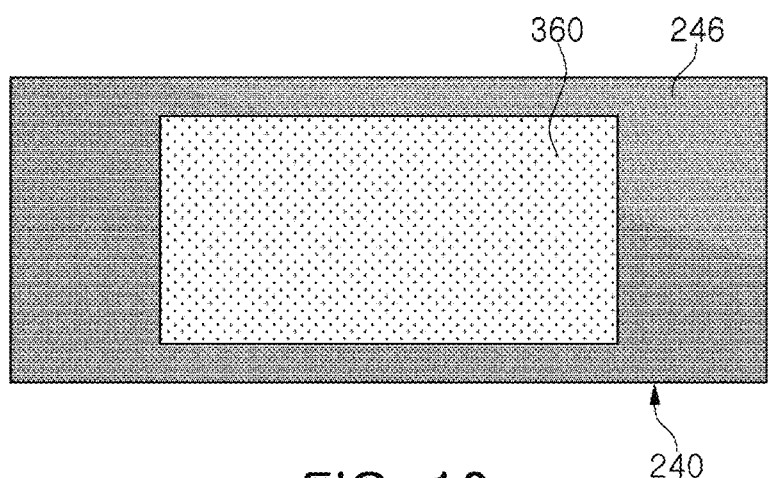
FIG. 10 is a plan view illustrating an example of a heat slug and a heat transfer member of the semiconductor package illustrated in FIG. 9.

FIG. 9 is a schematic cross-sectional view illustrating another example of a semiconductor package, and FIG. 10 is a plan view illustrating an example of a heat slug and a heat transfer member of the semiconductor package illustrated in FIG. 9.

Referring to FIGS. 9 and 10, a semiconductor package 300 includes a substrate 110, an electronic component 120, a bonding material 130, a heat slug 240, and an encapsulant 350.

Since the substrate 110, the electronic component 120, and the bonding material 130 are substantially the same as those of the semiconductor package 100 illustrated in FIG. 1, and the heat slug 240 is substantially the same as the heat slug 240 illustrated in FIG. 6, detailed descriptions thereof will be omitted.

The electronic component 120 and the heat slug 240 are embedded in the encapsulant 350. The encapsulant 350 has a predetermined strength to protect the electronic component 120 and the heat slug 240 from external impacts. As an example, the encapsulant 350 is an epoxy molding compound (EMC). The encapsulant 350 has an opening 352 disposed above the upper surface of the heat slug 240. The opening 352 is a single hole having a rectangular shape. The heat transfer member 360 is disposed in the opening 352, and is made of any one of a solder paste, a metal paste, and a conductive epoxy paste.

An upper surface of the heat transfer member 360 is even with an upper surface of the encapsulant 350, and thus is exposed outside the encapsulant 350.

Although not illustrated in FIG. 9, the bonding material 130 may extend along an entire perimeter of the heat slug 240. Furthermore, although not illustrated in FIG. 9, a thin layer of the bonding material 130 may be disposed between the upper surface of the electronic component 120 and the lower surface of the heat slug 240 on which the oxide coating layer 246 is formed.

Figure 11:
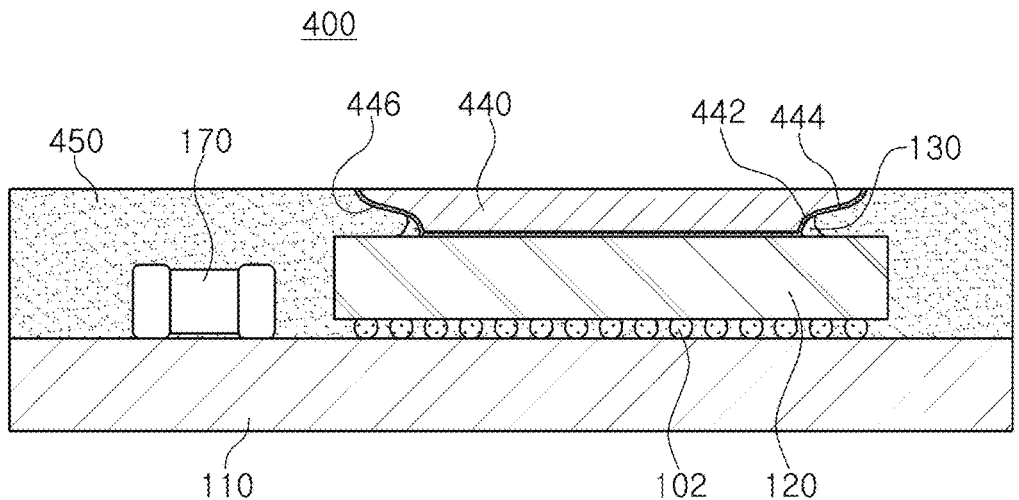
FIG. 11 is a schematic cross-sectional view illustrating another example of a semiconductor package.

FIG. 11 is a schematic cross-sectional view illustrating another example of a semiconductor package.

Referring to FIG. 11, a semiconductor package 400 includes a substrate 110, an electronic component 120, a bonding material 130, a heat slug 440, and an encapsulant 450.

Since the substrate 110, the electronic component 120, and the bonding material 130 are substantially the same as those of the semiconductor package 100 illustrated in FIG. 1, detailed descriptions thereof will be omitted.

The heat slug 440 is bonded to an upper surface of the electronic component 120 by the bonding material 130. The heat slug 440 dissipates heat transferred to the heat slug 440 from the electronic component 120. As an example, the heat slug 440 is made of copper (Cu) having a high thermal conductivity. However, a material of the heat slug 440 is not limited thereto, and the heat slug 440 may be made of gold (Au), aluminum (Al), nickel (Ni), stainless steel, or an alloy containing any combination of any two or more of copper (Cu), gold (Au), aluminum (Al), nickel (Ni), and stainless steel.

A side surface of the heat slug 440 extending between an edge of the lower surface of the heat slug 440 and an edge of an upper surface of the heat slug 440 forms a recess with the upper surface of the electronic component 120. An area of the upper surface of the heat slug 440 is greater than an area of the lower surface of the heat slug 440 so that the edge of the upper surface of the heat slug 440 protrudes beyond the edge of the lower surface of the heat slug 440. As an example, the side surface of the heat slug 440 includes a first curved surface 442 extending in a curved upward direction away from the edge of the lower surface of the heat slug 440 and having a first radius of curvature. and a second curved surface 444 extending in a curved upward direction from an upper end of the first curved surface 442 to the edge of the upper surface of the heat slug 440 and having a second radius of curvature different from the first radius of curvature of the first curved surface 442.

Although not illustrated in FIG. 11, the side surface of the heat slug 440 forming the recess with the upper surface of the electronic component 120 may extend along an entire perimeter of the heat slug 440. The side surface of the heat slug 440 may be formed, for example, by a half-etching process, or any other process capable of forming the side surface.

As described above in connection with FIG. 1, one result of the side surface of the heat slug 440 forming the recess with the upper surface of the electronic component 120 is that damage to the encapsulant 450 is reduced. For example, since the side surface of the heat slug 440 forms the recess with the upper surface of the electronic component 120, the occurrence of defects in the semiconductor package 400 caused by cracking occurring in the encapsulant 450 is reduced.

The heat slug 440 does not protrude outwardly beyond a side surface of the electronic component 120. In further detail, the edge of the upper surface of the heat slug 440 does not protrude outwardly beyond the side surface of the electronic component 120. For example, when viewed from above, the edge of the upper surface of the heat slug 440 does not protrude beyond an edge of the upper surface of the electronic component 120. For example, when viewed from above, the edge of the upper surface of the heat slug 440 may be aligned with the edge of the upper surface of the electronic component 120, or may be may be spaced inwardly toward a center of the heat slug 440 from the edge of the upper surface of the electronic component 120. For example, the heat slug 440 may be disposed within a space defined by planes extending upward from side surfaces of the electronic component 120 without contacting the planes, or the edge of the upper surface of the heat slug 440 may lie in one or more of the planes extending upward from the side surfaces of the electronic component 120.

Accordingly, the heat slug 440 is prevented from interfering with other components mounted on the substrate 110 near the electronic component 120.

An oxide coating layer 446 is formed on the side surface and the lower surface of the heat slug 440, but is not formed on the upper surface of the heat slug 440. Furthermore, the upper surface of the heat slug 440 is even with an upper surface of the encapsulant 450, and thus is exposed outside the encapsulant 450.

Although not illustrated in FIG. 11, the bonding material 130 may extend along an entire perimeter of the heat slug 440. Furthermore, although not illustrated in FIG. 11, a thin layer of the bonding material 130 may be disposed between the upper surface of the electronic component 120 and the lower surface of the heat slug 440 on which the oxide coating layer 446 is formed.

The electronic component 120 and the heat slug 440 are embedded in the encapsulant 450. The encapsulant 450 has a predetermined strength to protect the electronic component 120 and the heat slug 440 from external impacts. As an example, the encapsulant 450 is an epoxy molding compound (EMC). As described above, the upper surface of the heat slug 440 is even with the upper surface of the encapsulant 450, and thus is exposed outside the encapsulant 450.

In further detail, during a manufacturing process, the oxide coating layer 446 is formed on an entire surface of the heat slug 440, that is, on an upper surface, a side surface, and a lower surface of the heat slug 440, like the heat slug 240 illustrated in FIG. 6, and the heat slug 440 having the oxide coating layer 446 formed on the entire surface thereof is embedded in the encapsulant 450. Then, an upper surface of the encapsulant 450 is polished using a polishing process (for example, a half-etching process or a chemical mechanical planarization (CMP) process) until the upper surface of the heat slug 440 is exposed and the oxide coating layer 446 formed on the upper surface of the heat slug 440 is removed. Accordingly, the upper surface of the heat slug from which the oxide coating layer 446 has been removed becomes even with the upper surface of the encapsulant 450, and thus is exposed outside the encapsulant 450.

Figure 12:
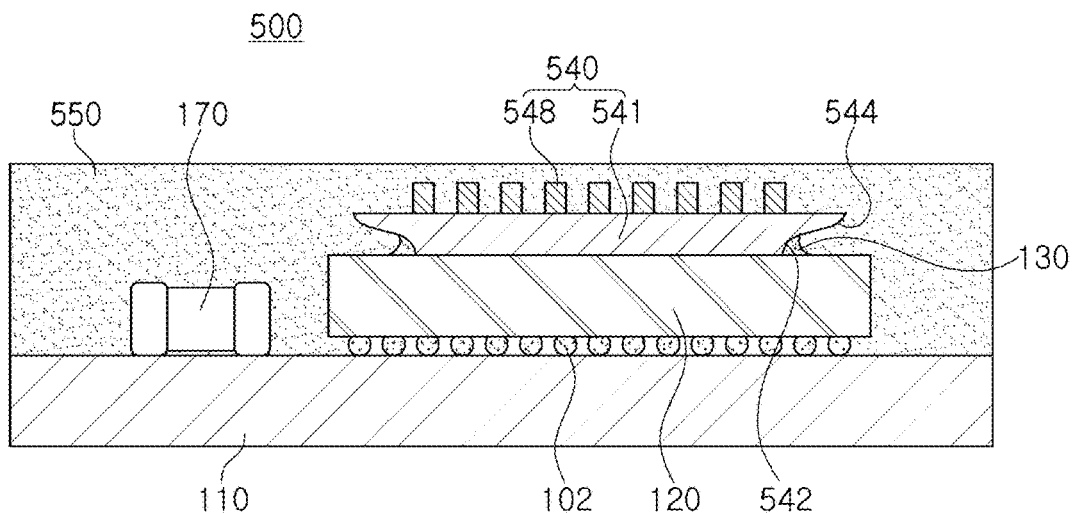
FIG. 12 is a schematic cross-sectional view illustrating another example of a semiconductor package.
Figure 13:
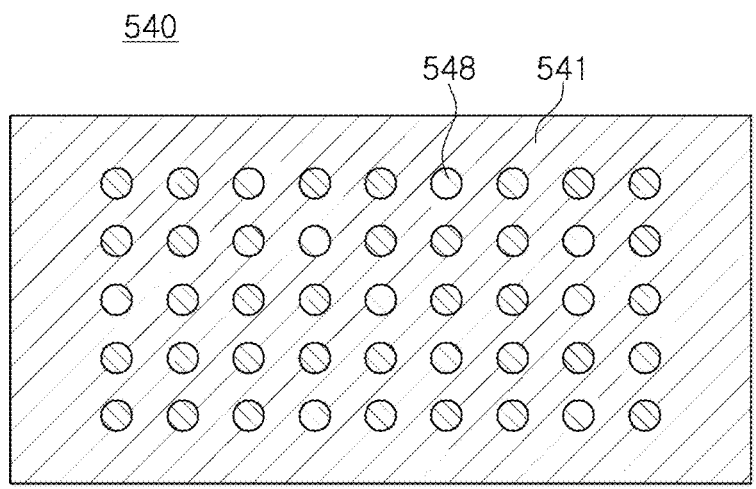
FIG. 13 is a plan view illustrating an example of a heat slug of the semiconductor package illustrated in FIG. 12.

FIG. 12 is a schematic cross-sectional view illustrating another example of a semiconductor package, and FIG. 13 is a plan view illustrating an example of a heat slug of the semiconductor package illustrated in FIG. 12.

Referring to FIGS. 12 and 13, a semiconductor package 500 includes a substrate 110, an electronic component 120, a bonding material 130, a heat slug 540, and an encapsulant 550.

Since the substrate 110, the electronic component 120, and the bonding material 130 are substantially the same as those of the semiconductor package 100 illustrated in FIG. 1, detailed descriptions thereof will be omitted.

The heat slug 540 is bonded to an upper surface of the electronic component 120 by the bonding material 130. The heat slug 540 dissipates heat transferred to the heat slug 540 from the electronic component 120. As an example, the heat slug 540 is made of copper (Cu) having a high thermal conductivity. However, a material of the heat slug 540 is not limited thereto, and the heat slug 540 may be made of gold (Au), aluminum (Al), nickel (Ni), stainless steel, or an alloy containing any combination of any two or more of copper (Cu), gold (Au), aluminum (Al), nickel (Ni), and stainless steel.

Although not illustrated in FIG. 12, the bonding material 130 may extend along an entire perimeter of the heat slug 540. Furthermore, although not illustrated in FIG. 12, a thin layer of the bonding material 130 may be disposed between the upper surface of the electronic component 120 and a lower surface of the heat slug 540.

The heat slug 540 includes a body 541 and a plurality of heat dissipation projections 548. The plurality of heat dissipation projections 548 extend from an upper surface of the body 541.

A side surface of the body 541 extending between an edge of a lower surface of the body 541 and an edge of the upper surface of the body 541 forms a recess with the upper surface of the electronic component 120. An area of the upper surface of the body 541 is greater than an area of the lower surface of the body 541 so that the edge of the upper surface of the body 541 protrudes beyond the edge of the lower surface of the body 541. As an example, the side surface of the body 541 includes a first curved surface 542 extending in a curved upward direction away from the edge of the lower surface of the body 541 and having a first radius of curvature, and a second curved surface 544 extending in a curved upward direction from an upper end of the first curved surface 542 to the edge of the upper surface of the body 541 and having a second radius of curvature different from the first radius of curvature of the first curved surface 542.

Although not illustrated in FIG. 12, the side surface of the body 541 forming the recess with the upper surface of the electronic component 120 may extend along an entire perimeter of the body 541. The side surface of the body 541 may be formed, for example, by a half-etching process, or any other process capable of forming the side surface.

As described above in connection with FIG. 1, one result of the side surface of the body 541 forming the recess with the upper surface of the electronic component 120 is that damage to the encapsulant 550 is reduced. For example, since the side surface of the body 541 forms the recess with the upper surface of the electronic component 120, the occurrence of defects in the semiconductor package 500 caused by cracking occurring in the encapsulant 550 is reduced.

The heat slug 540 does not protrude outwardly beyond a side surface of the electronic component 120. For example, when viewed from above, the edge of the upper surface of the body 541 does not protrude beyond an edge of the upper surface of the electronic component 120.

Accordingly, the heat slug 540 is prevented from interfering with other components mounted on the substrate 110 near the electronic component 120.

The electronic component 120 and the heat slug 540 are embedded in the encapsulant 550. The encapsulant 550 has predetermined strength to protect the electronic component 120 and the heat slug 540 from external impacts. As an example, the encapsulant 550 is an epoxy molding compound (EMC). The heat dissipation projections 548 of the heat slug 540 are embedded in the encapsulant 550 without being exposed outside the encapsulant 550.

Figure 14:
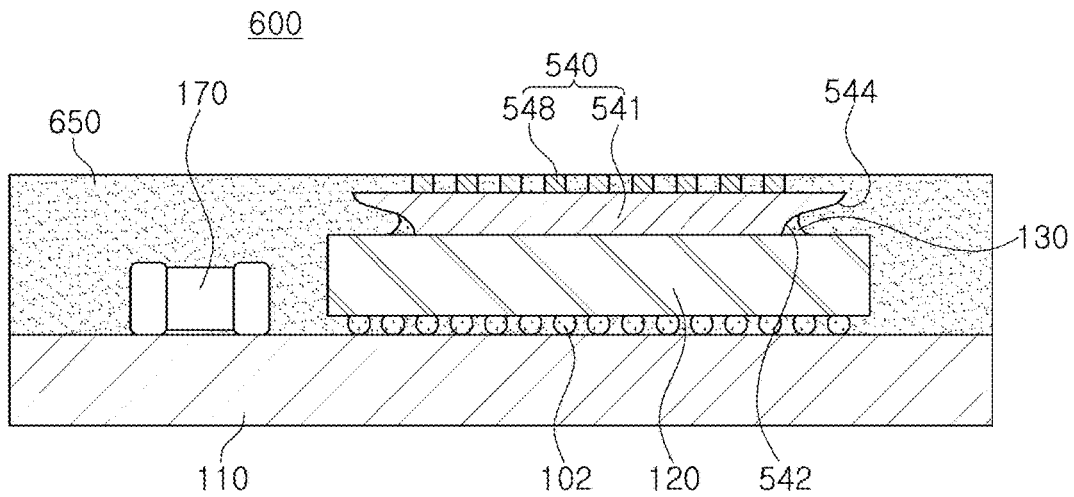
FIG. 14 is a schematic cross-sectional view illustrating another example of a semiconductor package.

FIG. 14 is a schematic cross-sectional view illustrating another example of a semiconductor package.

Referring to FIG. 14, a semiconductor package 600 includes a substrate 110, an electronic component 120, a bonding material 130, a heat slug 540, and an encapsulant 650.

Since the substrate 110, the electronic component 120, and the bonding material 130 are substantially the same as those of the semiconductor package 100 illustrated in FIG. 1, and the heat slug 540 is substantially the same as that of the semiconductor package 500 illustrated in FIG. 12, detailed descriptions thereof will be omitted.

Although not illustrated in FIG. 14, the bonding material 130 may extend along the entire perimeter of the heat slug 540. Furthermore, although not illustrated in FIG. 1, a thin layer of the bonding material 130 may be disposed between the upper surface of the electronic component 120 and the lower surface of the heat slug 540.

The electronic component 120 and the heat slug 540 are embedded in the encapsulant 650. The encapsulant 650 has a predetermined strength to protect the electronic component 120 and the heat slug 540 from external impacts. As an example, the encapsulant 650 is an epoxy molding compound (EMC). An upper surface of each of the heat dissipation projections 548 of the heat slug 540 is even with an upper surface of the encapsulant 650, and thus is exposed outside the encapsulant 550.

As an example, the semiconductor package 600 illustrated in FIG. 14 may be obtained by polishing an upper surface of the encapsulant 550 of the semiconductor package 500 illustrated in FIG. 12 using a polishing process (for example, a half-etching process or a chemical mechanical planarization (CMP) process) until an upper surface of each of the heat dissipation projections 548 of the heat slug 540 is even with the upper surface of the encapsulant layer 550 and is exposed outside the encapsulant 550. If necessary, an upper portion of one or more of the heat dissipation projections 548 may be removed by the polishing process so that all of the heat dissipation projections 548 have the same height.

Figure 15:
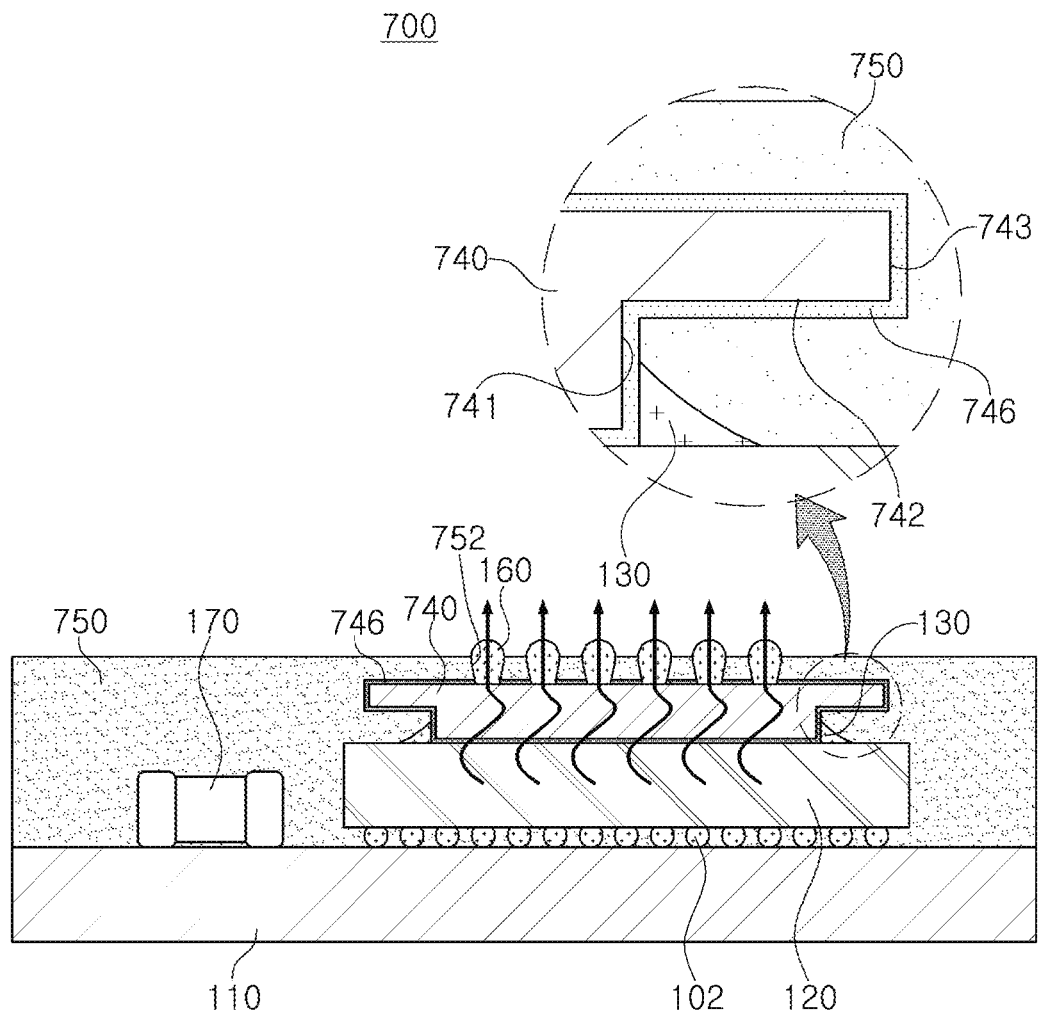
FIG. 15 is a schematic cross-sectional view illustrating another example of a semiconductor package.

FIG. 15 is a schematic cross-sectional view illustrating another example of a semiconductor package.

Referring to FIG. 15, a semiconductor package 700 includes a substrate 110, an electronic component 120, a bonding material 130, a heat slug 740, an encapsulant 750, and heat transfer members 160.

Since the substrate 110, the electronic component 120, and the bonding material 130 are substantially the same as those of the semiconductor package 100 illustrated in FIG. 1, detailed descriptions thereof will be omitted.

The heat slug 740 is bonded to an upper surface of the electronic component 120 by the bonding material 130. The heat slug 740 dissipates heat transferred to the heat slug 740 from the electronic component 120. As an example, the heat slug 740 is made of copper (Cu) having a high thermal conductivity. However, a material of the heat slug 740 is not limited thereto, and the heat slug 740 may be made of gold (Au), aluminum (Al), nickel (Ni), stainless steel, or an alloy containing any combination of any two or more of copper (Cu), gold (Au), aluminum (Al), nickel (Ni), and stainless steel.

A side surface of the heat slug 740 extending between an edge of a lower surface of the heat slug 740 and an edge of an upper surface of the heat slug 740 includes one step so that the side surface of the heat slug 740 forms a recess with the upper surface of the electronic component 120. An area of the upper surface of the heat slug 740 is greater than an area of the lower surface of the heat slug 740 so that an edge of the upper surface of the heat slug 740 protrudes beyond an edge of the lower surface of the heat slug 740. As an example, the side surface of the heat slug 740 includes a first flat surface 741 extending in a vertical upward direction away from the edge of the lower surface of the heat slug 740, a second flat surface 742 extending in a horizontal outward direction relative to a center of the heat slug 740 away from an upper end of the first flat surface 741, and a third flat surface 743 extending in a vertical upward direction from an end of the second flat surface 742 disposed farthest from the center of the heat slug 740 to the edge of the upper surface of the heat slug 740. Thus, the side surface of the heat slug 740 includes one step that steps up from the first flat surface 741 to the third flat surface 743.

Although not illustrated in FIG. 15, the side surface of the heat slug 740 forming the recess with the upper surface of the electronic component 120 may extend along an entire perimeter of the heat slug 740. The side surface of the heat slug 740 may be formed, for example, by a half-etching process, or any other process capable of forming the side surface.

Alternatively, the heat slug 740 may be molded by a pressing process, or any other process capable of forming the heat slug 740.

As described above in connection with FIG. 1, one result of the side surface of the heat slug 740 forming the recess with the upper surface of the electronic component 120 is that damage to the encapsulant 750 is reduced. For example, since the side surface of the heat slug 740 forms the recess with the upper surface of the electronic component 120, the occurrence of defects in the semiconductor package 700 caused by the cracking occurring in the encapsulant 750 is reduced.

In addition, an oxide coating layer 746 is formed on an entire surface of the heat slug 740, that is, on the an upper surface, a side surface, and a lower surface of the heat slug 740. The oxide coating layer 746 may be formed by a black oxide surface treatment. A specific surface area (a total surface area per unit of mass) of a surface of the oxide coating layer 746 is greater than a specific surface area of a surface of the heat slug 740 without the oxide coating layer 746. For example, a surface roughness of the surface of the oxide coating layer 746 with the oxide coating layer 746 is greater than a surface roughness of the surface of the heat slug 740 without the oxide coating layer 746, thereby increasing a contact area between the heat slug 740 and the encapsulant 750. Furthermore, oxygen bonding occurs between the oxide coating layer 746 and the encapsulant 750, thereby increasing a bonding force between the encapsulant 750 and the heat slug 740.

Although not illustrated in FIG. 15, the bonding material 130 may extend along an entire perimeter of the heat slug 740. Furthermore, although not illustrated in FIG. 15, a thin layer of the bonding material 130 may be disposed between the upper surface of the electronic component 120 and the lower surface of the heat slug 740 on which the oxide coating layer 746 is formed.

The heat slug 740 does not protrude outwardly beyond a side surface of the electronic component 120. In further detail, the edge of the upper surface of the heat slug 740 does not protrude outwardly beyond the side surface of the electronic component 120. For example, when viewed from above, the edge of the upper surface of the heat slug 740 does not protrude beyond an edge of the upper surface of the electronic component 120. For example, when viewed from above, the edge of the upper surface of the heat slug 740 may be aligned with the edge of the upper surface of the electronic component 120, or may spaced inwardly toward a center of the heat slug 740 from the edge of the upper surface of the electronic component 120. For example, the heat slug 740 may be disposed within a space defined by planes extending upward from side surfaces of the electronic component 120 without contacting any of the planes, or the edge of the upper surface of the heat slug 740 may lie in one or more of the planes extending upward from the side surfaces of the electronic component 120.

Accordingly, the heat slug 740 is prevented from interfering with other components mounted on the substrate 110 near the electronic component 120.

However, a disposition of the heat slug 740 is not limited to the dispositions described above, and an upper end portion of the heat slug 740 may protrude outwardly beyond the side surface of the electronic component 120 in certain circumstances. As an example, when another component (not illustrated), such as a semiconductor chip or a passive component, is disposed near the electronic component 120 and has a height less than a height of the upper end portion of the heat slug 740, there may be no interference between the other component disposed near the electronic component 120 and the heat slug 740 if the upper end portion of the heat slug 740 protrudes outwardly beyond the side surface of the electronic component 120 because the recess formed by the side surface of the heat slug 740 with the upper surface of the electronic component 120 may accommodate an upper portion of the other component disposed near the electronic component 120.

As an example, when a thickness of the heat slug 740 is 300 μm, and a vertical distance between an upper surface of the other component disposed near the electronic component 120 and the upper surface of the electronic component 120 is 160 μm, and the upper end portion of the heat slug 740 protrudes outwardly beyond the side surface of the electronic component 120, there may be no interference between the other component disposed near the electronic component 120 and the heat slug 740 because the recess formed by the side surface of the heat slug 740 with the upper surface of the electronic component 120 may accommodate the upper portion of the other component disposed near the electronic component 120.

Furthermore, when the upper end portion of the heat slug 740 protrudes outwardly beyond the side surface of the electronic component 120, a volume of the upper end portion of the heat slug 740 is increased. Therefore, a heat dissipation efficiency of the heat slug 740 is improved.

The electronic component 120 and the heat slug 740 are embedded in the encapsulant 750. The encapsulant 750 has a predetermined strength to protect the electronic component 120 and the heat slug 740 from external impacts. As an example, the encapsulant 750 is an epoxy molding compound (EMC). The encapsulant 750 has openings 752 disposed above the upper surface of the heat slug 740. The heat transfer members 160 are disposed in the openings 752. The heat transfer members 160 are made of any one of a solder paste, a metal paste, and a conductive epoxy paste.

A lower surface of each of the heat transfer members 160 is disposed on the upper surface of the heat slug 740, and an upper end portion of each of the heat transfer members 160 protrudes above an upper surface of the encapsulant 750 through a respective one of the openings 752.

Figure 16:
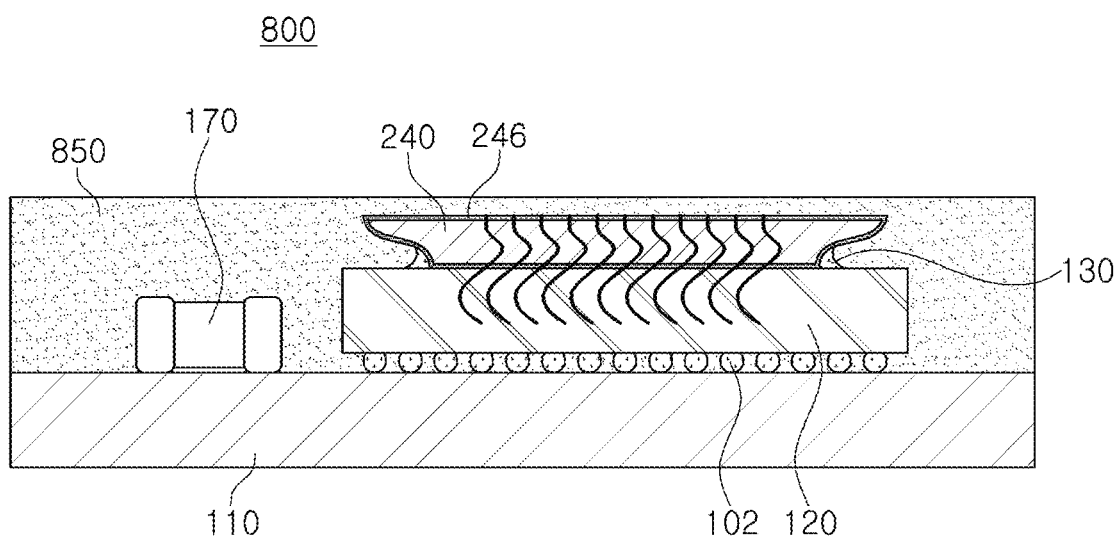
FIG. 16 is a schematic cross-sectional view illustrating another example of a semiconductor package.

FIG. 16 is a schematic cross-sectional view illustrating another example of a semiconductor package.

Referring to FIG. 16, a semiconductor package 800 includes a substrate 110, an electronic component 120, a bonding material 130, a heat slug 240, and an encapsulant 850.

Since the substrate 110, the electronic component 120, and the bonding material 130 are substantially the same as those of the semiconductor package 100 illustrated in FIG.

1, and the heat slug 240 is substantially the same as the heat slug 240 illustrated in FIG. 6, detailed descriptions thereof will be omitted.

An oxide coating layer 246 is formed on an entire surface of the heat slug 240, that is, on an upper surface, a side surface, and a lower surface of the heat slug 240. The oxide coating layer 246 may be formed by a black oxide surface treatment. A specific surface area (a total surface area per unit of mass) of a surface of the oxide coating layer 246, which is illustrated in FIG. 8, is greater than a specific surface area of a surface of the heat slug 240 without the oxide coating layer 246, which is illustrated in FIG. 7. For example, as illustrated in FIG. 8, a surface roughness of the surface of the oxide coating layer 246 is greater than a surface roughness of the surface of the heat slug 240 without the oxide coating layer 246 as illustrated in FIG. 7, thereby increasing a contact area between the heat slug 240 and the encapsulant 850. Furthermore, oxygen bonding occurs between the oxide coating layer 246 and the encapsulant 850, thereby increasing a bonding force between the encapsulant 750 and the heat slug 240.

In addition, as discussed above in connection with FIG. 6, a side surface of the heat slug 240 extending between an edge of the lower surface of the heat slug 240 and an edge of the upper surface of the heat slug 240 forms a recess with the upper surface of the electronic component 120.

Although not illustrated in FIG. 16, the side surface of the heat slug 240 forming the recess with the upper surface of the electronic component 120 may extend along an entire perimeter of the heat slug 240. The side surface of the heat slug 240 may be formed, for example, by a half-etching process, or any other process capable of forming the side surface.

Although not illustrated in FIG. 16, the bonding material 130 may extend along an entire perimeter of the heat slug 240. Furthermore, although not illustrated in FIG. 16, a thin layer of the bonding material 130 may be disposed between the upper surface of the electronic component 120 and the lower surface of the heat slug 240 on which the oxide coating layer 246 is formed.

The electronic component 120 and the heat slug 240 are embedded in the encapsulant 850. The encapsulant 850 has a predetermined strength to protect the electronic component 120 and the heat slug 240 from external impacts. As an example, the encapsulant 850 is an epoxy molding compound (EMC). The heat slug 240 is embedded in the encapsulant 850 so that the heat slug 240 is not exposed outside the encapsulant 850.

Figure 17:
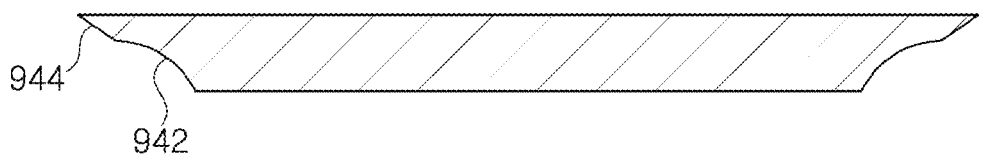
FIG. 17 is a schematic cross-sectional view illustrating another example of a heat slug.

FIG. 17 is a schematic cross-sectional view illustrating another example of a heat slug.

Referring to FIG. 17, a heat slug 940 is made of copper (Cu) having a high thermal conductivity. However, a material of the heat slug 940 is not limited thereto, and the heat slug 940 may be made of gold (Au), aluminum (Al), nickel (Ni), stainless steel, or an alloy containing any combination of any two or more of copper (Cu), gold (Au), aluminum (Al), nickel (Ni), and stainless steel.

The heat slug 940 may replace the heat slug in any of the semiconductor packages illustrated in FIGS. 1, 9, 11, 12, and 14-16.

A side surface of the heat slug 940 extending between an edge of a lower surface of the heat slug 940 and an edge of an upper surface of the heat slug 940 forms a recess with the upper surface of the electronic component 120 illustrated in any of FIGS. 1, 9, 11, 12, and 14-16. An area of the upper surface of the heat slug 940 is greater than an area of the lower surface of the heat slug 940 so that the edge of the upper surface of the heat slug 940 protrudes beyond the edge of the lower surface of the heat slug 940. As an example, the side surface of the heat slug 940 includes a curved surface 942 extending in a curved upward direction away from the edge of the lower surface of the heat slug 940, and a flat surface 944 extending in an inclined upward direction from an upper end of the curved surface 942 to the edge of the upper surface of the heat slug 940 so that the flat surface 944 is inclined relative to the upper surface of the electronic component 120.

Although not illustrated in FIG. 17, the side surface of the heat slug 940 forming the recess with the upper surface of the electronic component 120 may extend along an entire perimeter of the heat slug 940. The side surface of the heat slug 940 may be formed, for example, by a half-etching process, or any other process capable of forming the side surface.

As described above in connection with FIG. 1, one result of the side surface of the heat slug 940 forming the recess with the upper surface of the electronic component 120 is that damage to the encapsulant 150 illustrated in FIG. 1 is reduced. For example, since the side surface of the heat slug 940 forms the recess with the upper surface of the electronic component 120, the occurrence of defects in the semiconductor package caused by cracking occurring in the encapsulant 150 is reduced.

Figure 18:
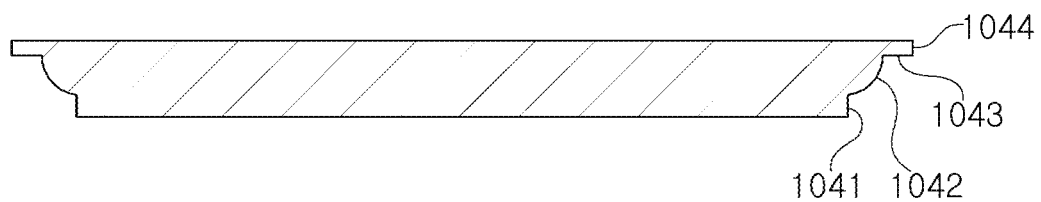
FIG. 18 is a schematic cross-sectional view illustrating another example of a heat slug.

FIG. 18 is a schematic cross-sectional view illustrating another example of a heat slug.

Referring to FIG. 18, a heat slug 1040 is made of copper (Cu) having a high thermal conductivity. However, a material of the heat slug 1040 is not limited thereto, and the heat slug 1040 may be made of gold (Au), aluminum (Al), nickel (Ni), stainless steel, or an alloy containing any combination of any two or more of copper (Cu), gold (Au), aluminum (Al), nickel (Ni), and stainless steel.

The heat slug 1040 may replace the heat slug in any of the semiconductor packages illustrated in FIGS. 1, 9, 11, 12, and 14-16.

A side surface of the heat slug 1040 extending between an edge of a lower surface of the heat slug 1040 and an edge of an upper surface of the heat slug 1040 forms a recess with the upper surface of the electronic component 120 illustrated in any of FIGS. 1, 9, 11, 12, and 14-16. An area of the upper surface of the heat slug 1040 is greater than an area of the lower surface of the heat slug 1040 so that the edge of the upper surface of the heat slug 1040 protrudes beyond the edge of the lower surface of the heat slug 1040. As an example, the side surface of the heat slug 1040 includes a first flat surface 1041 extending in a vertical upward direction away from the edge of the lower surface of the heat slug 1040, a curved surface 1042 extending in a curved upward direction away from an upper end of the first flat surface 1041, a second flat surface 1043 extending away from an upper end of the curved surface 1042 in a horizontal outward direction relative to a center of the heat slug 1040, and a third flat surface 1044 extending in a vertical upward direction from an end of the second flat surface 1043 disposed farthest from the center of the heat slug 1040 to the edge of the upper surface of the heat slug 1040.

Although not illustrated in FIG. 18, the side surface of the heat slug 1040 forming the recess with the upper surface of the electronic component 120 may extend along an entire perimeter of the heat slug 1040. The side surface of the heat slug 1040 may be formed, for example, by a half-etching process, or any other process capable of forming the side surface.

As described above in connection with FIG. 1, one result of the side surface of the heat slug 1040 forming the recess with the upper surface of the electronic component 120 is that damage to the encapsulant 150 illustrated in FIG. 1 is reduced. For example, since the side surface of the heat slug 1040 forms the recess with the upper surface of the electronic component 120, the occurrence of defects in the semiconductor package caused by the cracking occurring in the encapsulant 150 is reduced.

Figure 19:
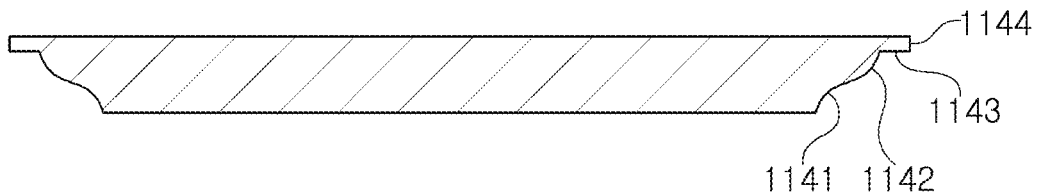
FIG. 19 is a schematic cross-sectional view illustrating another example of a heat slug.

FIG. 19 is a schematic cross-sectional view illustrating another example of a heat slug.

Referring to FIG. 19, a heat slug 1140 is made of copper (Cu) having a high thermal conductivity. However, a material of the heat slug 1140 is not limited thereto, and the heat slug 1140 may be made of gold (Au), aluminum (Al), nickel (Ni), stainless steel, or an alloy containing any combination of any two or more of copper (Cu), gold (Au), aluminum (Al), nickel (Ni), and stainless steel.

The heat slug 1140 may replace the heat slug in any of the semiconductor packages illustrated in FIGS. 1, 9, 11, 12, and 14-16.

A side surface of the heat slug 1140 extending between an edge of a lower surface of the heat slug 1140 and an edge of an upper surface of the heat slug 1140 forms a recess with the upper surface of the electronic component 120 illustrated in any of FIGS. 1, 9, 11, 12, and 14-16. An area of the upper surface of the heat slug 1140 is greater than an area of the lower surface of the heat slug 1140 so that the edge of the upper surface of the heat slug 1140 protrudes beyond the edge of the lower surface of the heat slug 1140. As an example, the side surface of the heat slug 1140 includes a first curved surface 1141 extending in a curved upward direction away from the edge of the lower surface of the heat slug 1140 and having a first radius of curvature, a second curved surface 1142 extending in a curved upward direction away from an upper end of the first curved surface 1141 and having a second radius of curvature different from the first radius of curvature, a first flat surface 1143 extending away from an upper end of the second curved surface 1142 in a horizontal outward direction relative to a center of the heat slug 1140, and a second flat surface 1144 extending in a vertical upward direction from an end of the first flat surface 1143 disposed farthest from the center of the heat slug 1140 to the edge of the upper surface of the heat slug 1140.

Although not illustrated in FIG. 19, the side surface of the heat slug 1140 forming the recess with the upper surface of the electronic component 120 may extend along an entire perimeter of the heat slug 1140. The side surface of the heat slug 1140 may be formed, for example, by a half-etching process, or any other process capable of forming the side surface.

As described above in connection with FIG. 1, one result of the side surface of the heat slug 1140 forming the recess with the upper surface of the electronic component 120 is that damage to the encapsulant 150 illustrated in FIG. 1 is reduced. For example, since the side surface of the heat slug 1140 forms the recess with the upper surface of the electronic component 120, the occurrence of defects in the semiconductor package caused by the cracking occurring in the encapsulant 150 is reduced.

Figure 20:
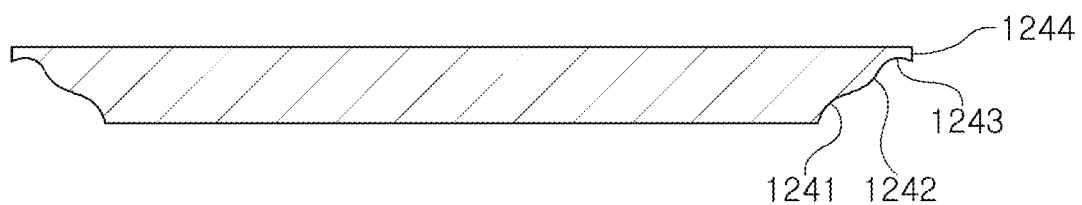
FIG. 20 is a schematic cross-sectional view illustrating another example of a heat slug.

FIG. 20 is a schematic cross-sectional view illustrating another example of a heat slug.

Referring to FIG. 20, a heat slug 1240 is made of copper (Cu) having a high thermal conductivity. However, a material of the heat slug 1240 is not limited thereto, and the heat slug 1240 may be made of gold (Au), aluminum (Al), nickel (Ni), stainless steel, or an alloy containing any combination of any two or more of copper (Cu), gold (Au), aluminum (Al), nickel (Ni), and stainless steel.

The heat slug 1240 may replace the heat slug in any of the semiconductor packages illustrated in FIGS. 1, 9, 11, 12, and 14-16.

A side surface of the heat slug 1240 extending between an edge of a lower surface of the heat slug 1240 and an edge of an upper surface of the heat slug 1240 forms a recess with the upper surface of the electronic component 120 illustrated in any of FIGS. 1, 9, 11, 12, and 14-16. An area of the upper surface of the heat slug 1240 is greater than an area of the lower surface of the heat slug 1240 so that the edge of the upper surface of the heat slug 1240 protrudes beyond the edge of the lower surface of the heat slug 1240. As an example, the side surface of the heat slug 1240 includes a first curved surface 1241 extending in a curved upward direction away from the edge of the lower surface of the heat slug 1240 and having a first radius of curvature, a second curved surface 1242 extending in a curved upward direction away from an upper end of the first curved surface 1241 and having a second radius of curvature different from the first radius of curvature, a third curved surface 1243 extending in a curved upward direction away from an upper end of the second curved surface 1242 and having a third radius of curvature different from the first radius of curvature and the second radius of curvature, and a flat surface 1244 extending in a vertical upward direction from an upper end of the third curved surface 1243 to the edge of the upper surface of the heat slug 1240.

Although not illustrated in FIG. 20, the side surface of the heat slug 1240 forming the recess with the upper surface of the electronic component 120 may extend along an entire perimeter of the heat slug 1240. The side surface of the heat slug 1240 may be formed, for example, by a half-etching process, or any other process capable of forming the side surface.

As described above in connection with FIG. 1, one result of the side surface of the heat slug 1240 forming the recess with the upper surface of the electronic component 120 is that damage to the encapsulant 150 illustrated in FIG. 1 is reduced. For example, since the side surface of the heat slug 1240 forms the recess with the upper surface of the electronic component 120, the occurrence of defects in the semiconductor package caused by the cracking occurring in the encapsulant 150 is reduced.

Figure 21:
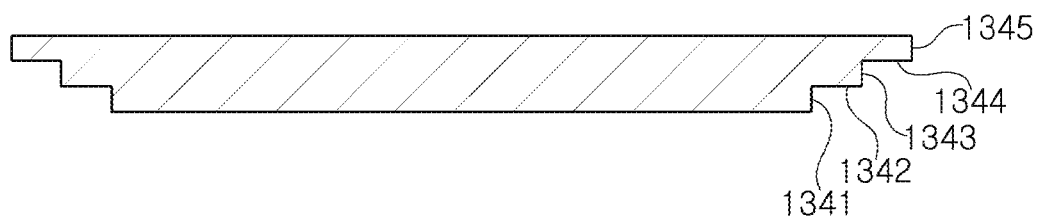
FIG. 21 is a schematic cross-sectional view illustrating another example of a heat slug.

FIG. 21 is a schematic cross-sectional view illustrating another example of a heat slug.

Referring to FIG. 21, a heat slug 1340 is made of copper (Cu) having a high thermal conductivity. However, a material of the heat slug 1340 is not limited thereto, and the heat slug 1340 may be made of gold (Au), aluminum (Al), nickel (Ni), stainless steel, or an alloy containing any combination of any two or more of copper (Cu), gold (Au), aluminum (Al), nickel (Ni), and stainless steel.

The heat slug 1340 may replace the heat slug in any of the semiconductor packages illustrated in FIGS. 1, 9, 11, 12, and 14-16.

A side surface of the heat slug 1340 extending between an edge of a lower surface of the heat slug 1340 and an edge of an upper surface of the heat slug 1340 includes two steps so that the side surface forms a recess with the upper surface of the electronic component 120 illustrated in any of FIGS. 1, 9, 11, 12, and 14-16. An area of the upper surface of the heat slug 1340 is greater than an area of the lower surface of the heat slug 1340 so that the edge of the upper surface of the heat slug 1340 protrudes beyond the edge of the lower surface of the heat slug 1340. As an example, the side surface of the heat slug 1340 includes a first flat surface 1341 extending in a vertical upward direction away from the edge of the lower surface of the heat slug 1340, a second flat surface 1342 extending in a horizontal outward direction relative to a center of the heat slug 1340 away from an upper end of the first flat surface 1341, a third flat surface 1343 extending in a vertical upward direction away from an end of the second flat surface 1342 disposed farthest from a center of the heat slug 1340, a fourth flat surface 1344 extending in a horizontal outward direction relative to the center of the heat slug 1340 away from an upper end of the third flat surface 1343, and a fifth flat surface 1345 extending in a vertical upward direction from an end of the fourth flat surface 1344 disposed farthest from the center of the heat slug 1340 to the edge of the upper surface of the heat slug 1340. Thus, the side surface of the heat slug 1340 includes a first step that steps up from the first flat surface 1341 to the third flat surface 1343, and a second step that steps up from the third flat surface 1343 to the fifth flat surface 1345.

Although not illustrated in FIG. 21, the side surface of the heat slug 1340 forming the recess with the upper surface of the electronic component 120 may extend along an entire perimeter of the heat slug 1340. The side surface of the heat slug 1340 may be formed, for example, by a half-etching process, or any other process capable of forming the side surface.

As described above in connection with FIG. 1, one result of the side surface of the heat slug 1340 forming the recess with the upper surface of the electronic component 120 is that damage to the encapsulant 150 illustrated in FIG. 1 is reduced. For example, since the side surface of the heat slug 1340 forms the recess with the upper surface of the electronic component 120, the occurrence of defects in the semiconductor package caused by the cracking occurring in the encapsulant 150 is reduced.

As described above, the examples of a heat slug described above reduce the occurrence of defects in a semiconductor package including the heat slug and improve a heat dissipation performance of the semiconductor package.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor package comprising:
   a substrate;
   an electronic component mounted on an upper surface of the substrate so that a lower surface of the electronic component faces the upper surface of the substrate;
   a heat slug disposed on an upper surface of the electronic component so that a lower surface of the heat slug faces the upper surface of the electronic component;
   a bonding material bonding the heat slug to the upper surface of the electronic component; and
   an encapsulant in which the heat slug and the electronic component are embedded,
   wherein a side surface of the heat slug comprises:
      a first curved surface having a first radius of curvature; and
      a second curved surface extending from the first curved surface and having a second radius of curvature different from the first radius of curvature.

2. The semiconductor package of claim 1, wherein an area of the upper surface of the heat slug is greater than an area of the lower surface of the heat slug.

3. The semiconductor package of claim 1, wherein the first curved surface extends in a curved upward direction away from an edge of the lower surface of the heat slug, and
   the second curved surface extends in a curved upward direction from an upper end of the first curved surface to an edge of the upper surface of the heat slug.

4. The semiconductor package of claim 1, wherein the edge of the upper surface of the heat slug does not protrude beyond an edge of the electronic component when the semiconductor package is viewed from above.

5. The semiconductor package of claim 1, further comprising an oxide coating layer disposed on the side surface of the heat slug.

6. The semiconductor package of claim 1, wherein the encapsulant comprises an opening disposed above the upper surface of the heat slug.

7. The semiconductor package of claim 6, further comprising a heat transfer member disposed in the opening,
   wherein the heat transfer member is made of any one of a solder paste, a metal paste, and a conductive epoxy paste.

8. The semiconductor package of claim 7, wherein a lower end of the heat transfer member is disposed in contact with the upper surface of the heat slug.

9. The semiconductor package of claim 1, wherein the upper surface of the heat slug is even with an upper surface of the encapsulant so that the upper surface of the heat slug is exposed outside the encapsulant.

10. The semiconductor package of claim 1, wherein the heat slug comprises:
    a body having a lower surface facing the upper surface of the electronic component; and
    a plurality of heat dissipation projections extending in a vertical upward direction from an upper surface of the body.

11. The semiconductor package of claim 10, wherein an upper end portion of each of the heat dissipation projections protrudes through an upper surface of the encapsulant in a vertical upward direction so that the upper end portion of each of the heat dissipation projections is exposed outside the encapsulant.

12. The semiconductor package of claim 1, wherein the heat slug is made of copper.

13. The semiconductor package of claim 1, wherein the side surface of the heat slug extends between an edge of the lower surface of the heat slug and an edge of an upper surface of the heat slug, and forms a recess with the upper surface of the electronic component.

14. A semiconductor package comprising:
    a substrate;
    an electronic component mounted on an upper surface of the substrate so that a lower surface of the electronic component faces the upper surface of the substrate;

a heat slug disposed on an upper surface of the electronic component so that a lower surface of the heat slug faces the upper surface of the electronic component;
a bonding material bonding the heat slug to the upper surface of the electronic component; and
an encapsulant in which the heat slug and the electronic component are embedded,
wherein a side surface of the heat slug extending between an edge of the lower surface of the heat slug and an edge of an upper surface of the heat slug comprises:
a first curved surface extending in a curved upward direction away from the edge of the lower surface of the heat slug; and
a flat surface extending in an inclined upward direction from an upper end of the first curved surface to the edge of the upper surface of the heat slug so that the flat surface is inclined relative to the upper surface of the electronic component.

15. The semiconductor package of claim 14, wherein an area of the upper surface of the heat slug is greater than an area of the lower surface of the heat slug.

16. The semiconductor package of claim 14, wherein the side surface of the heat slug forms a recess with the upper surface of the electronic component.

17. A semiconductor package comprising:
a substrate;
an electronic component mounted on an upper surface of the substrate so that a lower surface of the electronic component faces the upper surface of the substrate;
a heat slug disposed on an upper surface of the electronic component so that a lower surface of the heat slug faces the upper surface of the electronic component;
a bonding material disposed in contact with a side surface of the heat slug and the upper surface of the electronic component and bonding the heat slug to the upper surface of the electronic component; and
an encapsulant in which the electronic component, the heat slug, and the bonding material are embedded,
wherein a portion of the encapsulant is disposed between an upper end portion of the heat slug and the upper surface of the electronic component, and
the side surface of the heat slug extends from an edge of the lower surface of the heat slug to an edge of an upper surface of the heat slug and comprises:
a curved surface; and
a flat surface.

18. The semiconductor package of claim 17, wherein the side surface of the heat slug forms a recess with the upper surface of the electronic component, and
the bonding material and the portion of the encapsulant disposed between the upper end portion of the heat slug and the upper surface of the electronic component are disposed in the recess.

19. The semiconductor package of claim 17, wherein the side surface of the heat slug forms a recess with the upper surface of the electronic component.

* * * * *